United States Patent
Kim et al.

(10) Patent No.: US 10,492,345 B2
(45) Date of Patent: Nov. 26, 2019

(54) DISPLAY APPARATUS AND METHOD OF CONTROLLING THE SAME

(71) Applicant: SAMSUNG ELECTRONICS CO., LTD., Suwon-si (KR)

(72) Inventors: Sung Ki Kim, Seoul (KR); Sru Kim, Anyang-si (KR); Dong Gyu Lee, Suwon-si (KR); Hyun Jun Jung, Yongin-si (KR); Jong Pil Seo, Suwon-si (KR); Sung Su Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/935,614

(22) Filed: Mar. 26, 2018

(65) Prior Publication Data
US 2019/0021189 A1    Jan. 17, 2019

(30) Foreign Application Priority Data
Jul. 14, 2017    (KR) .......... 10-2017-0089552

(51) Int. Cl.
*H05K 5/00*    (2006.01)
*H05K 7/00*    (2006.01)
*H05K 7/20*    (2006.01)

(52) U.S. Cl.
CPC ......... *H05K 7/20972* (2013.01); *H05K 7/202* (2013.01); *H05K 7/20145* (2013.01); *H05K 7/20181* (2013.01); *H05K 7/20209* (2013.01); *H05K 5/0017* (2013.01)

(58) Field of Classification Search
CPC ..................................................... H05K 5/00
See application file for complete search history.

(56) References Cited

U.S. PATENT DOCUMENTS

| | | | |
|---|---|---|---|
| 2011/0058326 A1* | 3/2011 | Idems | G09F 9/30 361/679.21 |
| 2011/0187962 A1 | 8/2011 | Oh et al. | |
| 2015/0009627 A1 | 1/2015 | Dunn et al. | |
| 2017/0172016 A1 | 6/2017 | Kang | |

FOREIGN PATENT DOCUMENTS

| | | |
|---|---|---|
| JP | 2010-134198 A | 6/2010 |
| JP | 2014-170215 A | 9/2014 |

OTHER PUBLICATIONS

Search Report dated Jun. 28, 2018, issued by the International Searching Authority in International Application No. PCT/KR2018/003160 (PCT/ISA/210).

* cited by examiner

*Primary Examiner* — Jerry Wu
(74) *Attorney, Agent, or Firm* — Sughrue Mion, PLLC

(57) ABSTRACT

A display apparatus and a method for dissipating heat are provided. The display apparatus may include a housing including an inlet and an outlet; a display panel disposed in the housing; a first cooling flow path, through which a first flow of air flows, the first cooling flow path connecting the inlet to the outlet; a second cooling flow path formed in the housing to allow a second flow of air to flow around the display panel to exchange heat with the display panel; and a heat exchange device disposed in the housing. The heat exchange device may be configured to allow the second flow of air to exchange heat with the first flow of air, and supply outside air to the second cooling flow path or discharge the second flow of air in the second cooling flow path to an outside of the display apparatus.

15 Claims, 14 Drawing Sheets

DISPLAY APPARATUS AND METHOD OF CONTROLLING THE SAME

CROSS-REFERENCE TO RELATED APPLICATION

This application claims priority from Korean Patent Application No. 10-2017-0089552, filed on Jul. 14, 2017, in the Korean Intellectual Property Office, the disclosure of which is incorporated herein by reference.

BACKGROUND

1. Field

Apparatuses and method consistent with example embodiments relate to a display apparatus, and more particularly, to an outdoor display apparatus having a heat dissipation structure.

2. Description of the Related Art

Generally, a display apparatus is an apparatus which displays an image on a screen such as a television, a monitor for a computer, a digital information display, and the like. In recent years, many display apparatuses have been deployed outdoors, for example, as digital billboards, digital signage, etc.

With an outdoor display apparatus, when a display panel is directly exposed to direct sunlight, a surface temperature of the display panel may rise and the display panel may undergo a significant amount of deterioration.

Also, a display apparatus may include a display panel and a backlight unit which emits light toward a rear surface of the display panel. The display panel may include a pair of substrates which face each other with a liquid crystal layer therebetween. The backlight unit may include a light source which emits light toward the display panel. The light source of the backlight unit may also generate heat, which may contribute to the display panel's deterioration.

Accordingly, the display apparatus may include a heat dissipation structure for preventing deterioration of the display panel. The heat dissipation structure may include a fan and an air filter.

The above-noted heat dissipation structure, however, has limited applicability because of its considerable volume. In addition, the air filter inside the heat dissipation structure requires replacement on a regular basis, which drives up its maintenance cost.

SUMMARY

One or more exemplary embodiments provide a display apparatus capable of improving cooling efficiency of a display module to prevent deterioration of a display panel.

It is another aspect of the present disclosure to provide a display apparatus capable of protecting a display module from outside foreign substances such as moisture and/or dust while cooling the display module by using outside air.

It is still another aspect of the present disclosure to provide a display apparatus configured to maintain balance between an internal pressure and an external pressure of the display apparatus even when a temperature changes.

Additional aspects of the present disclosure will be set forth in part in the description which follows and, in part, will be obvious from the description, or may be learned by practice of the present disclosure.

In accordance with an aspect of an example embodiment, a display apparatus may include a housing including an inlet and an outlet; a display panel disposed in the housing; a first cooling flow path, through which a first flow of air flows, the first cooling flow path connecting the inlet to the outlet; a second cooling flow path formed in the housing to allow a second flow of air to flow around the display panel to exchange heat with the display panel; and a heat exchange device disposed in the housing. The heat exchange device may be configured to allow the second flow of air, which flows through the second cooling flow path, to exchange heat with the first flow of air, which flows through the first cooling flow path, and perform at least one of supplying outside air to the second cooling flow path, and discharging the second flow of air in the second cooling flow path to an outside of the display apparatus.

The heat exchange device may include a casing, a first air blower disposed in the casing to suction in the first flow of air through the inlet, and a second air blower disposed in the casing to allow the second flow of air in the second cooling flow path to flow.

The casing may include a vent configured to connect the first cooling flow path with the second cooling flow path.

The casing may include a filter configured to prevent foreign substances from flowing in through the vent.

The foreign substances may include moisture and dust.

The display apparatus may further include a controller configured to control a rotational speed of the first air blower. Here, the controller may be further configured to control the rotational speed of the first air blower to supply the outside air to the second cooling flow path by keeping a first air pressure at the first air blower to be higher than a second air pressure of the second cooling flow path. Also, the controller may be further configured to control the rotational speed of the first air blower to discharge the second flow of air in the second cooling flow path to the outside by keeping the first air pressure at the first air blower to be lower than the second air pressure of the second cooling flow path.

The controller may be further configured to control the first air blower to reduce the rotational speed of the first air blower to discharge the second flow of air in the second cooling flow path to the outside from the housing in response to the second air pressure of the second cooling flow path being higher than a predetermined pressure.

The display apparatus may further include a pressure sensor disposed at the second cooling flow path.

The controller may be further configured to control the first air blower to increase the rotational speed of the first air blower to supply the outside air to the second cooling flow path in response to an internal temperature of the second cooling flow path being higher than a predetermined temperature.

The display apparatus may further include a temperature sensor disposed at the second cooling flow path.

The casing may include an opening through which the first flow of air, which has cooled the display panel, flows into the heat exchange device, and the temperature sensor may be disposed at, at least one of the opening and the controller.

The vent may be disposed to be adjacent to the first air blower.

The heat exchange device may include a first heat exchange device of a first size and a second heat exchange device of a second size different from the first size.

The display apparatus may further include a heat transfer member disposed between the display panel and the heat exchange device.

The casing may include a first opening through which the first flow of air is flown into the heat exchange device by the first air blower; a first window through which the first flow of air, which flows in through the first opening, is discharged; a second opening through which the second flow of air, which has cooled the display panel, is flown into the heat exchange device by the second air blower, and a second window through which the second flow of air, which flows in through the second opening, is discharged. Here, the vent may be disposed to be adjacent to the first opening and the second window.

In accordance with an aspect of an example embodiment, a display apparatus may include a housing including an inlet and an outlet; a display panel disposed in the housing; a first cooling flow path, through which a first flow of air from an outside of the display apparatus flows, the first cooling flow path connecting the inlet to the outlet; a second cooling flow path formed in the housing to allow a second flow of air to flow around the display panel to exchange heat with the display panel; and a heat exchange device disposed in the housing, the heat exchange device being configured to allow the second flow of air, which flows through the second cooling flow path, to exchange heat with the first flow of air, which flows through the first cooling flow path. Here, the heat exchange device may include a casing, a vent provided at the casing to connect the first cooling flow path with the second cooling flow path to communicate, and a filter configured to cover the vent to prevent foreign substances from flowing in through the vent.

The heat exchange device may include an air blower disposed to suction in the first flow of air through the inlet, and the air blower may be configured to perform at least one of supplying outside air to the second cooling flow path through the vent and suctioning in the second flow of air in the second cooling flow path through the vent.

The display apparatus may further include a controller configured to control the air blower. Here, the controller may be configured to control the air blower to increase a rotational speed of the air blower to supply the outside air to the second cooling flow path in response to a temperature of the display panel being higher than a predetermined temperature. Also, the controller may be configured to control the air blower to reduce the rotational speed of the air blower to discharge the second flow of air in the second cooling flow path to the outside from the housing in response to a pressure of the second cooling flow path being higher than a predetermined pressure.

The display apparatus may further include a temperature sensor disposed to measure an internal temperature of the second cooling flow path. Here, the temperature sensor may be disposed at, at least one of the controller and an opening through which the second flow of air in the second cooling flow path flows into the heat exchange device.

In accordance with an aspect of an example embodiment, a method of controlling a display apparatus may include measuring a temperature and a pressure of a cooling flow path formed in a housing to cool a display panel by using sensors disposed at the cooling flow path, and controlling, by a controller, an air blower according to the measured temperature and pressure. Here, the controlling, by the controller, of the air blower includes controlling the air blower to increase a rotational speed of the air blower to supply air to the cooling flow path in response to the measured temperature being higher than a predetermined temperature, and controlling the air blower to reduce the rotational speed of the air blower to discharge the air in the cooling flow path outward from the housing in response to the measured pressure being higher than a predetermined pressure.

BRIEF DESCRIPTION OF THE DRAWINGS

These and/or other aspects of the present disclosure will become apparent and more readily appreciated from the following description of the embodiments, taken in conjunction with the accompanying drawings of which.

DETAILED DESCRIPTION

Figure 1:
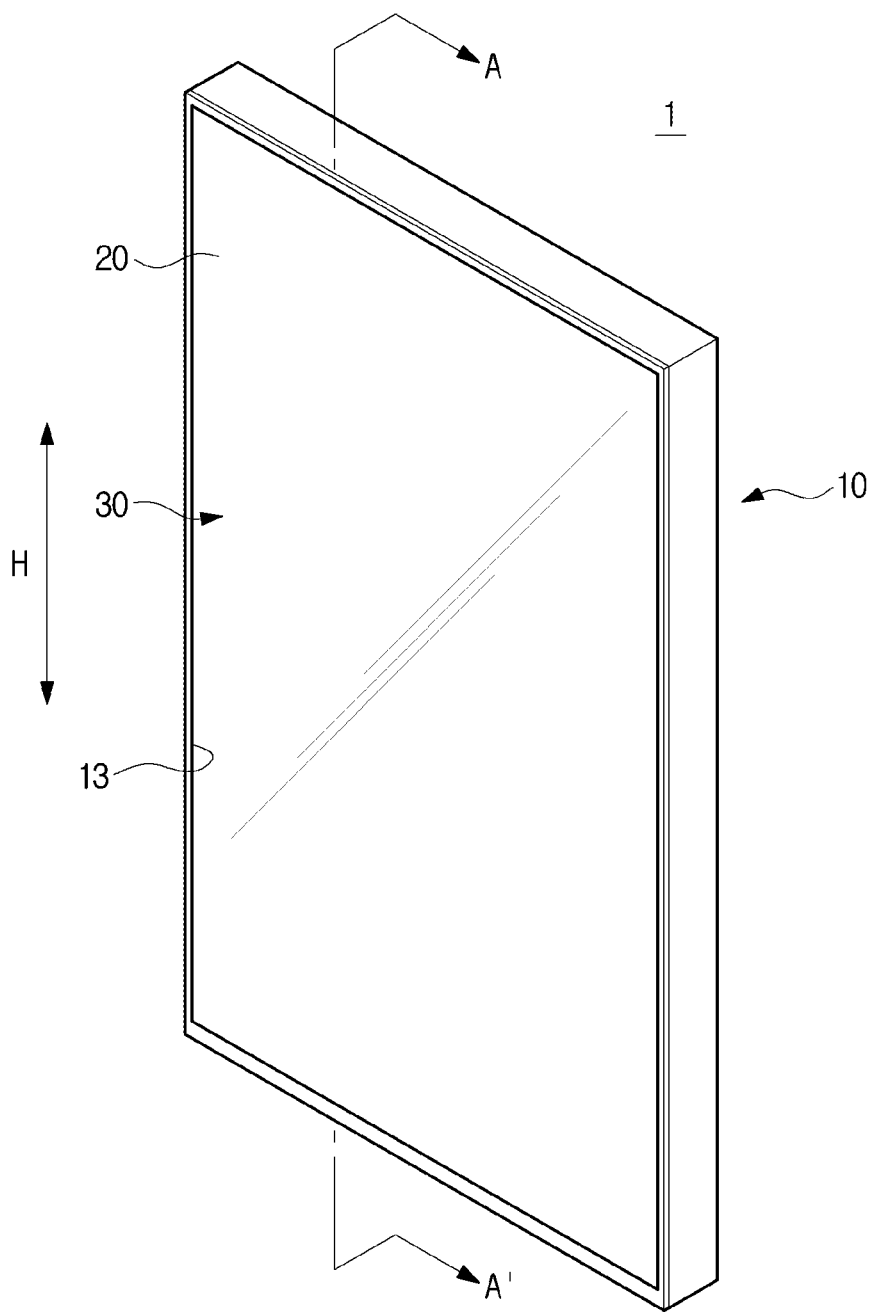
FIG. 1 is a perspective view of a display apparatus according to an example embodiment.

Embodiments disclosed in the specification and components shown in the drawings are merely examples of the present disclosure and various modifications capable of replacing the example embodiments and drawings of the present specification may be made at the time of filing the present application.

Also, throughout the drawings of the specification, like reference numerals or symbols refer to components or elements configured to perform substantially identical functions.

Also, the terms used herein are to explain the example embodiments but are not intended to limit and/or define the present disclosure. Singular forms, unless defined otherwise in context, include plural forms, and vice versa. Throughout the specification, the terms "comprise," "have," or the like are used herein to specify the presence of stated features, numbers, steps, operations, elements, components or combinations thereof but do not preclude the presence or addition of one or more other features, numbers, steps, operations, elements, components, or combinations thereof.

Content may be displayed at a display apparatus. For example, content may include a video file or audio file played by a video player which is one of applications, a music file played by a music player application, a photo file displayed on a photo gallery application, a webpage file displayed on a web browser, and the like. Also, content may include received broadcasting signals.

The content may include a video file, an audio file, a text file, an image file, and a webpage displayed or played by applications. Also, the content may include a video file and/or an audio file included in received broadcasting signals.

In the example embodiments of the present disclosure, content received from the outside or stored content may include broadcasting signals, a video file, an audio file, a text file, an image file, and a webpage, which are executed in response to a user input (e.g., a touch input and the like). Also, the term "video" may be used interchangeably with "movie," "moving images," etc.

Content may include an application screen and a user interface which forms the application screen. Also, content may include one piece or a plurality of pieces of content.

Vents, openings, fans, etc. may be "connected" to each other through one or more airways. In other words, connected vents, openings, fans, etc. may signify that an air flow may travel from one element to another through one or more common airways. Being "connected" in this fashion does not necessarily imply that the two elements are physically conjoined.

Also, even though the terms including ordinals such as "first," "second," and the like may be used for describing various components, the components will not be limited by the terms and the terms are used only for distinguishing one element from others. For example, without departing from the scope of the present invention, a first component may be referred to as a second component, and similarly, the second component may be referred to as the first component. The term "and/or" includes any and all combinations or one of a plurality of associated listed items.

Meanwhile, the terms "front," "rear," "top," "bottom," and the like used herein are defined based on the drawings, and shapes and positions of components are not limited thereto.

Hereinafter, the example embodiments will be described in detail with reference to the attached drawings.

Figure 2:
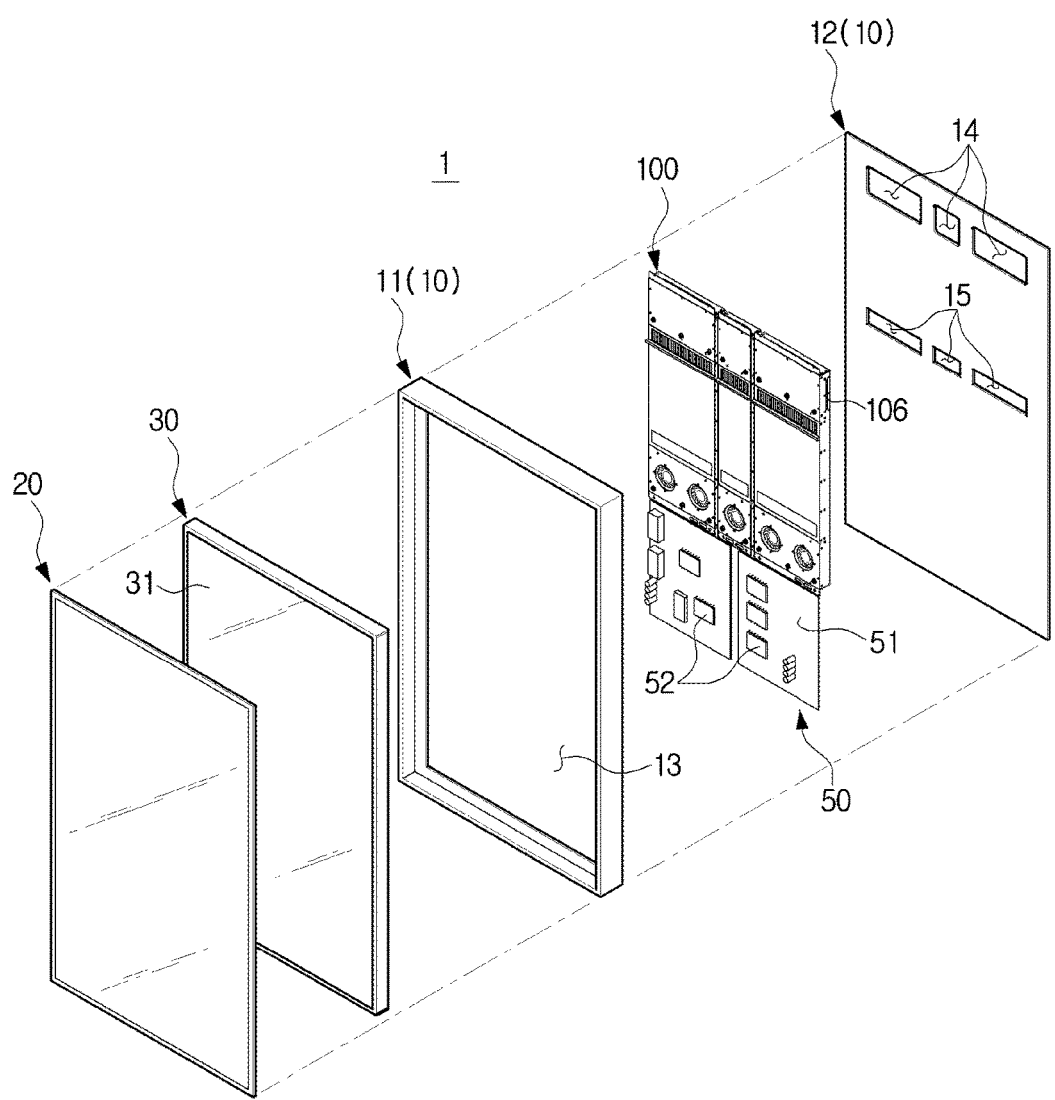
FIG. 2 is an exploded perspective view of the display apparatus shown in FIG. 1.

FIG. 1 is a perspective view of a display apparatus according to an example embodiment. FIG. 2 is an exploded perspective view of the display apparatus shown in FIG. 1.

As shown in FIGS. 1 and 2, a display apparatus 1 may include a housing 10 which forms an exterior of the display apparatus 1. The housing 10 may be installed outdoors. The housing 10 may include an opening 13. In detail, the opening 13 may be formed at a front surface of the housing 10. Also, the housing 10 may include inlets 14 and outlets 15.

The housing 10 may include a first frame 11. The first frame 11 may have a box shape (e.g., a rectangular shape) with a front side and a rear side which are open. The open front of the first frame 11 may be defined as the opening 13. That is, the opening 13 may be formed at the front of the first frame 11.

The housing 10 may further include a second frame 12. The second frame 12 may be coupled to the first frame 11. In detail, the second frame 12 may be coupled to the rear opening of the first frame 11 to form the exterior of the display apparatus 1 with the first frame 11. The inlets 14 and the outlets 15 may be formed at the second frame 12. The inlets 14 may be formed at a top of the second frame 12 to allow outside air to flow into the housing 10. The outlets 15 may be formed at a central part of the second frame 12 to discharge the outside air which flows into the housing 10 through the inlets 14 to the outside of the housing 10. The outlets 15 may be formed at the second frame 12 to be located below the inlets 14. However, positions of the inlets 14 and the outlets 15 are not limited to the above example and are variously changeable.

The display apparatus 1 may further include a protective glass 20 disposed to protect a display module 30. The protective glass 20 may be disposed in front of the display module 30 to protect the display module 30. In detail, the protective glass 20 may be coupled to the opening 13 of the housing 10.

The protective glass 20 may have a size corresponding to a size of the display module 30. In detail, the protective glass 20 may have a size corresponding to a size of a display panel 31 of the display module 30. In more detail, the protective glass 20 may be disposed corresponding to a display area of the display panel 31, in which an image is displayed.

The display apparatus 1 may further include the display module 30 which includes the display panel 31 and a backlight unit (not shown). The display module 30 may display content. The content displayed at the display module 30 may be content received from the outside or stored content. The display module 30 may be disposed in the housing 10. The display module 30 may be disposed in the housing 10 to be located in the rear of the protective glass 20. Also, the display module 30 may be disposed in the housing 10 to allow heat to be concentrated on a rear surface of the display panel 31 rather than a front surface thereof.

The display apparatus 1 may further include a heat exchange device 100. The heat exchange device 100 may be disposed in the rear of the display module 30. The heat exchange device 100 may be coupled to the rear surface of the display module 30 to absorb heat from the display module 30 using a heat conduction method.

The heat exchange device 100 may be disposed on the rear surface of the display module 30 to allow heat inside the housing 10 to be concentrated on the rear of the display panel 31. That is, the heat exchange device 100 may be disposed on the rear surface of the display module 30 and configured to allow the heat inside the housing 10 to be concentrated on the rear surface of the display panel 31 and be dissipated. Here, the heat inside the housing 10 may be generated from at least one of the display module 30 and a controller 50. Also, the heat inside the housing 10 may be generated by sunlight incident on the display apparatus 1. The heat inside the housing 10 may be concentrated on the heat exchange device 100 by using a heat conduction method. A detailed configuration of the heat exchange device 100 will be described below.

Figure 4:
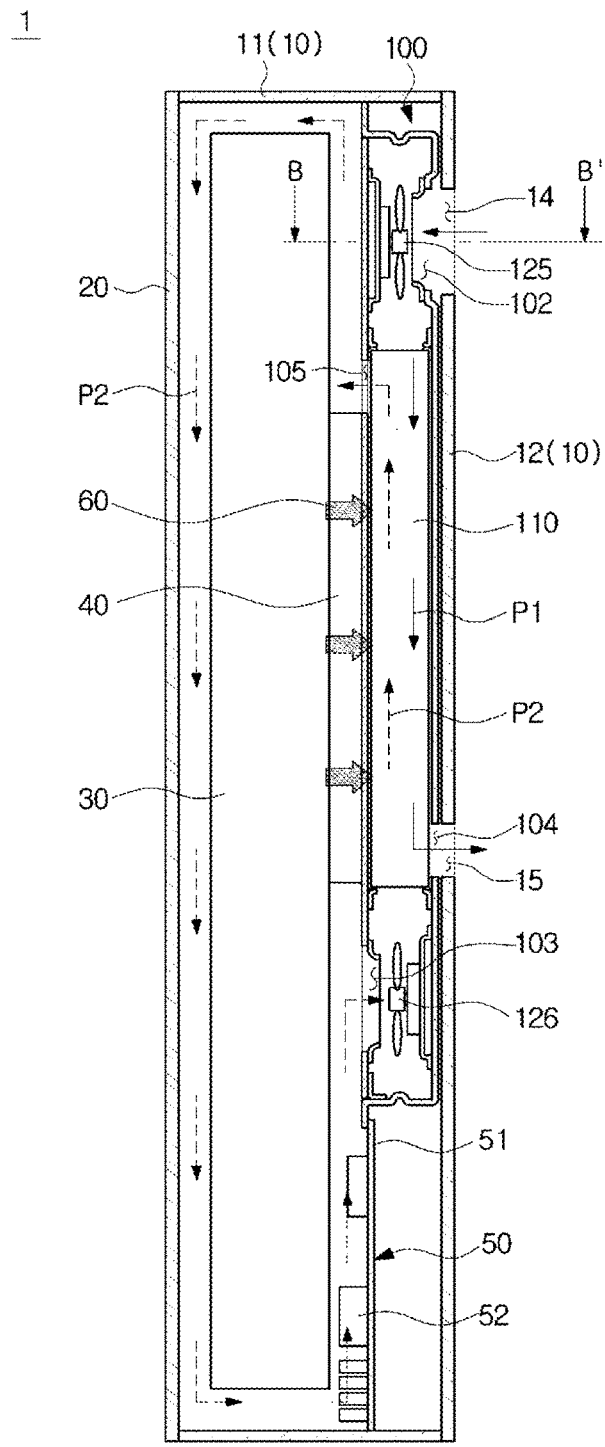
FIG. 4 is a cross-sectional view illustrating the display apparatus taken along line A-A' of FIG. 1.

The display apparatus 1 may further include a heat transfer member 40 (refer to FIG. 4). The heat transfer member 40 may be disposed between the display module 30 and the heat exchange device 100. In detail, the heat transfer member 40 may be closely disposed between the display module 30 and the heat exchange device 100 to transfer heat received from the display module 30 to the heat exchange device 100 through a heat conduction method.

The heat transfer member 40 may remove air present between the display module 30 and the heat exchange device 100. In detail, the air may prevent heat, which is generated from or passes through the display module 30, from being transferred to the heat exchange device 100. The heat transfer member 40 may be closely disposed between the display module 30 and the heat exchange device 100 to remove the air present between the display module 30 and the heat exchange device 100 and as a result to effectively transfer the heat, which is generated from or passes through the display module 30, to the heat exchange device 100.

The heat transfer member 40 may include at least one of a heat dissipation pad and a metal member. For example, the heat dissipation pad may include a heat-conducting resin layer and a heat-conducting metal layer. Here, the heat-conducting resin layer may include silicone. Also, the heat-conducting metal layer may include metallic filler such as aluminum and the like. However, the type of the heat dissipation pad is not limited to the above example. For example, the metal member may include aluminum. However, the type of the metal member is not limited to aluminum.

The display apparatus 1 may further include the controller 50. The controller 50 may be disposed in the housing 10 to drive the display module 30.

The controller 50 includes a memory configured to store algorithms for controlling operations of the components in the display apparatus 1 or data of programs reproducing the algorithms and a processor configured to perform the operations using the data stored in the memory. Here, the memory and the processor may be embodied as separate chips. Also, the memory and the processor may be embodied as single chips or a plurality of chips.

The controller 50 may be disposed to be approximately collinear with the heat exchange device 100 in a vertical direction H of the display apparatus 1. Since the controller 50 and the heat exchange device 100 are disposed to be collinear in the vertical direction H of the display apparatus 1 as described above, the display apparatus 1 may be embodied as a slimmer design. Also, the display apparatus 1 may be embodied to have a uniform thickness in the vertical direction H.

The controller 50 may be disposed below the heat exchange device 100. However, it is adequate as long as the controller 50 can be disposed to be approximately collinear with the heat exchange device 100 in the vertical direction H of the display apparatus 1, but a position thereof is not limited to being below the heat exchange device 100. That is, the controller 50 may be disposed above the heat exchange device 100.

The controller 50 may include a circuit board 51.

The controller 50 may further include at least one electronic component 52 mounted on the circuit board 51. The at least one electronic component 52 may include a central processing unit (CPU), a switching mode power supply (SMPS), a laser diode (LD), and the like, which mutually transmit and receive information and perform functions thereof.

Figure 3:
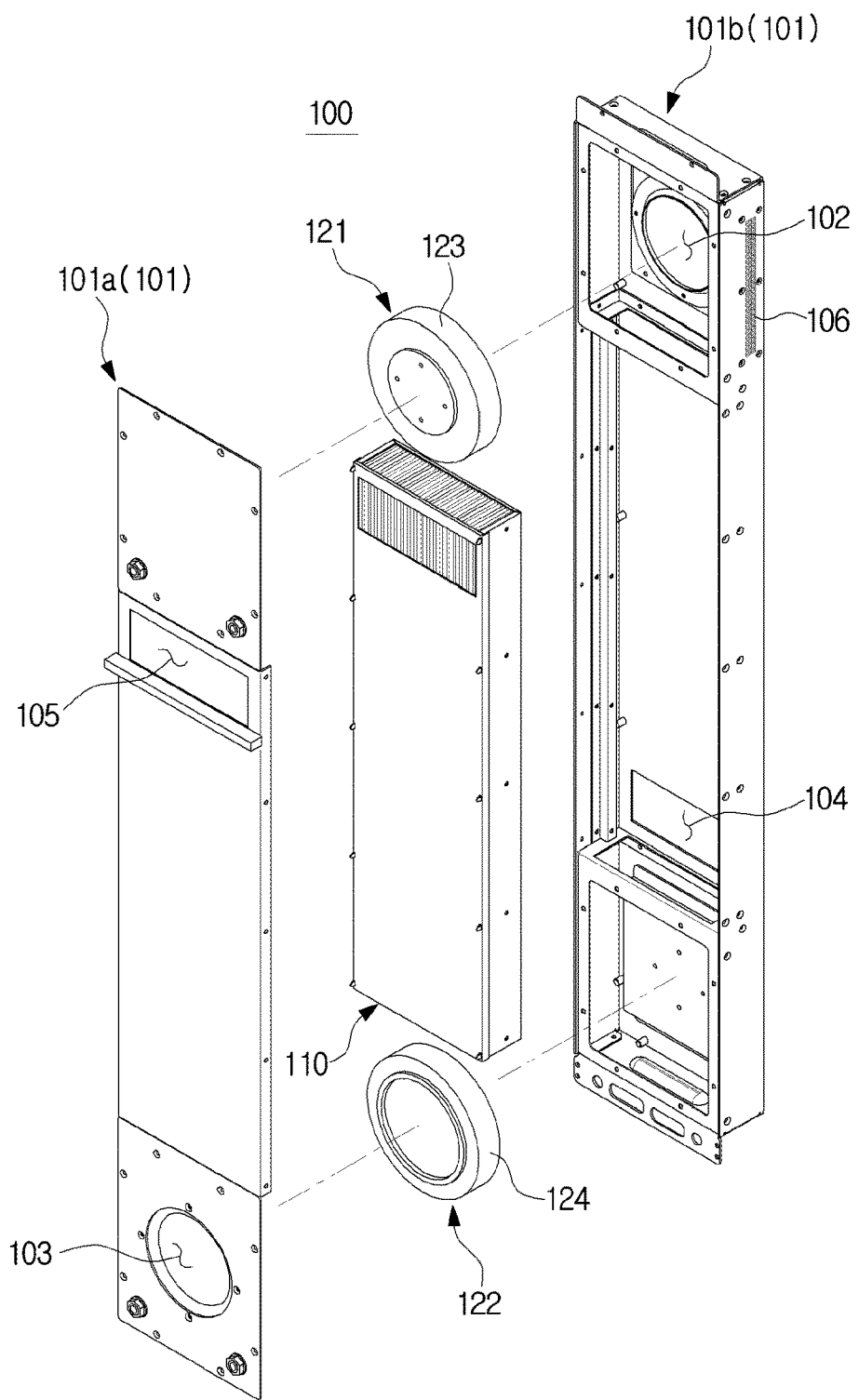
FIG. 3 is an exploded perspective view of a heat exchange device shown in FIG. 2.
Figure 5:
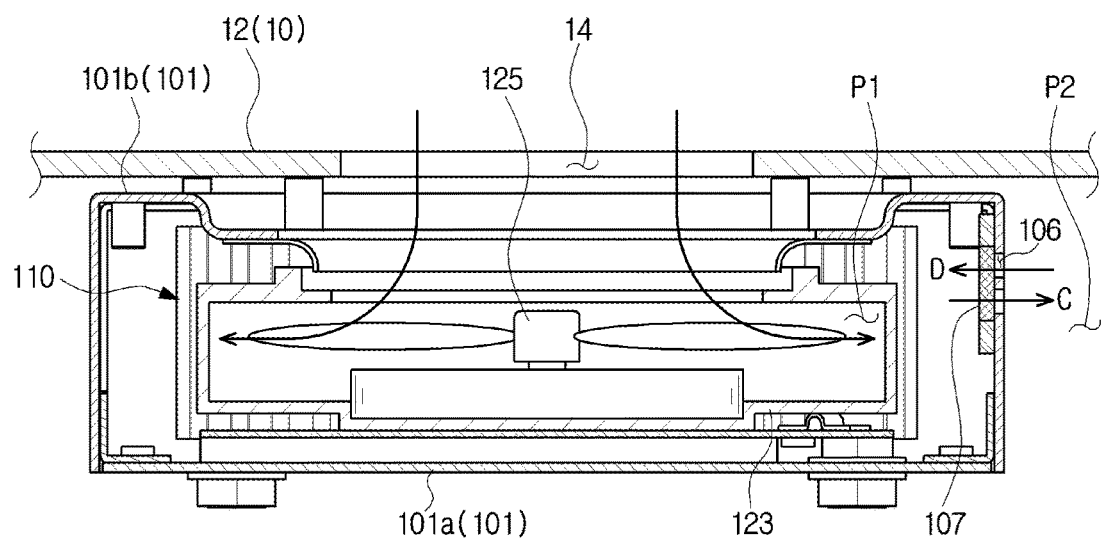
FIG. 5 is a cross-sectional view illustrating the display apparatus taken along line B-B' of FIG. 4.
Figure 6:
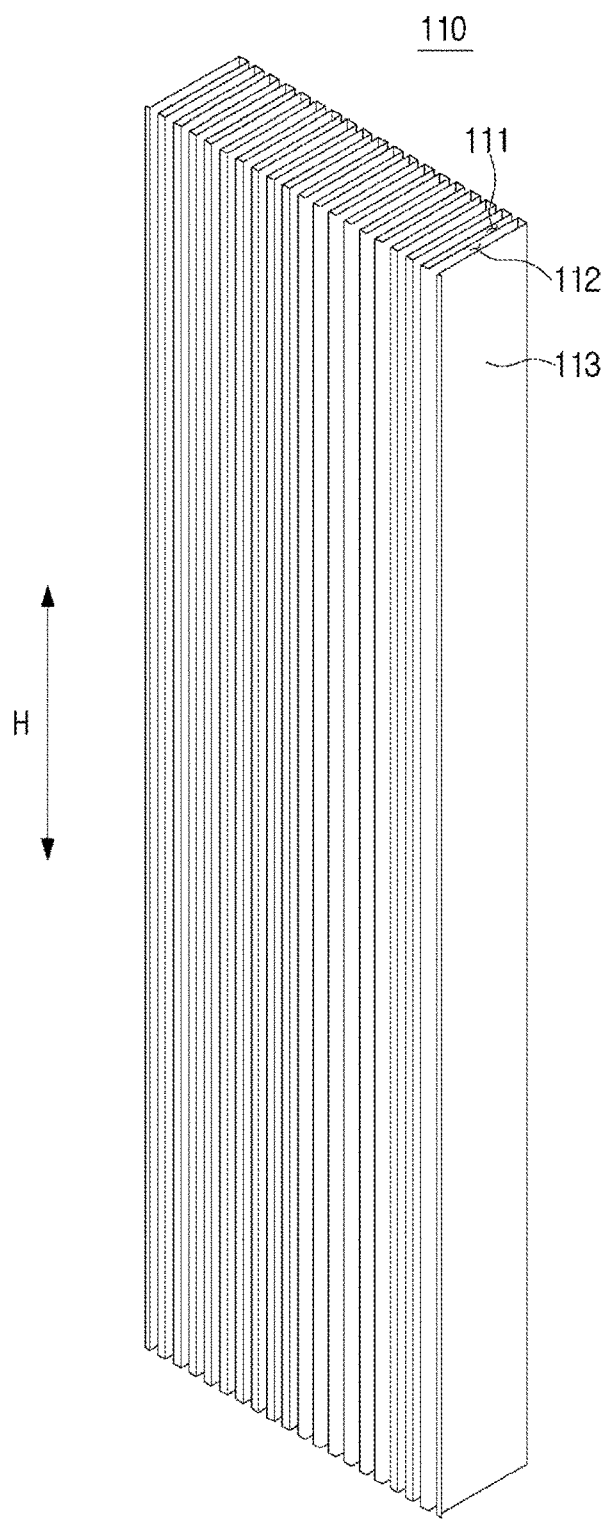
FIG. 6 is a perspective view a heat exchanger shown in FIG. 4.
Figure 7:
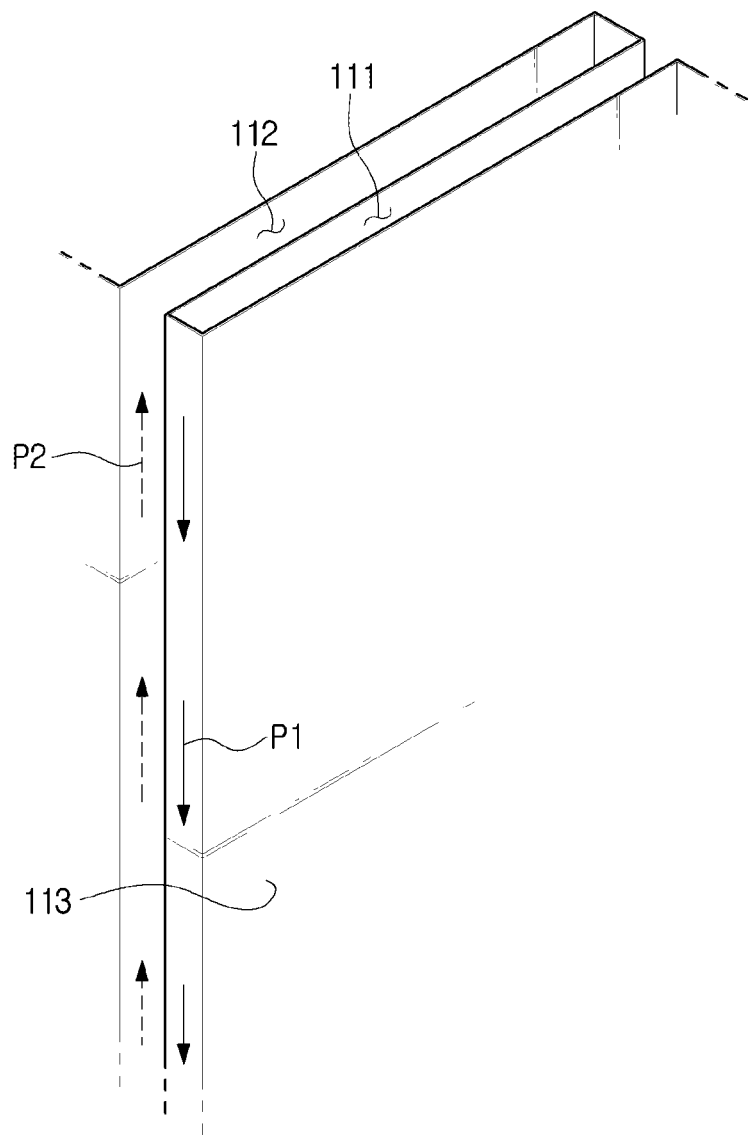
FIG. 7 is an enlarged view illustrating a part of the heat exchanger shown in FIG. 6.
Figure 8:
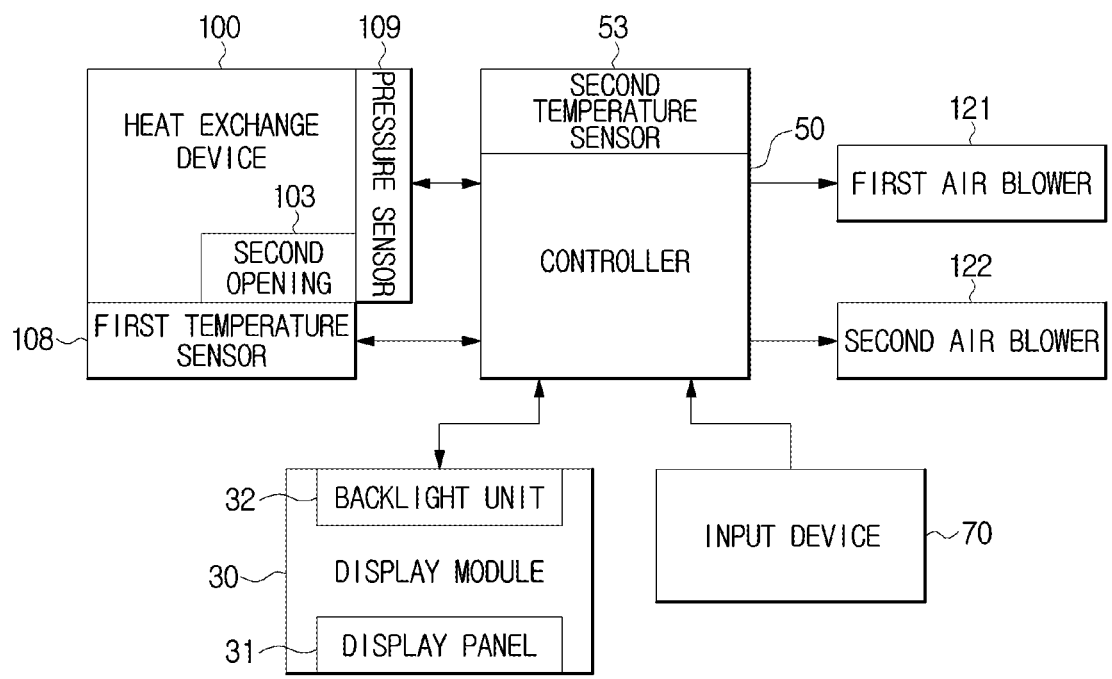
FIG. 8 is a control-block diagram of the display apparatus shown in FIG. 1.

FIG. 3 is an exploded perspective view of the heat exchange device 100 shown in FIG. 2. FIG. 4 is a cross-sectional view illustrating the display apparatus taken along line A-A' of FIG. 1. FIG. 5 is a cross-sectional view illustrating the display apparatus taken along line B-B' of FIG. 4. FIG. 6 is a perspective view a heat exchanger shown in FIG. 4. FIG. 7 is an enlarged view illustrating a part of the heat exchanger shown in FIG. 6. FIG. 8 is a control-block diagram of the display apparatus shown in FIG. 1.

Referring to FIGS. 3 to 5, the heat exchange device 100 may include a casing 101 which forms an exterior of the heat exchange device 100. The casing 101 may include a first opening 102 and a second opening 103. The first opening 102 may be disposed to allow outside air to flow into the casing 101. The second opening 103 may be disposed to allow air heat-exchanged with the display module 30 in the display apparatus 1 to flow into the casing 101.

The casing 101 may include a first casing 101a. The first casing 101a may be disposed to face the display module 30. In detail, the first casing 101a may be disposed to face the display module 30 and may form a front exterior of the heat exchange device 100.

The second opening 103 may be formed at the first casing 101a. The second opening 103 may be formed at a bottom of the first casing 101a. Also, a second window 105, disposed to allow the air which flows into the casing 101 through the second opening 103 to be discharged outward from the casing 101, may be formed at the first casing 101a. That is, the air which flows into the casing 101 through the second opening 103 may sequentially pass through a second air blower 122 (e.g., a fan) and a heat exchanger 110 and then be discharged outward from the casing 101 through the second window 105. The second window 105 may be formed at the first casing 101a to be located above the second opening 103. However, positions of the second window 105 and the second opening 103 are not limited to the above example and are variously changeable.

The casing 101 may further include a second casing 101b. The second casing 101b may be disposed to face the second frame 12 of the housing 10. In detail, the second casing 101b may be disposed to face the second frame 12 and may form a rear exterior of the heat exchange device 100.

The first opening 102 may be formed at the second casing 101b. The first opening 102 may be formed at a top of the second casing 101b. Also, a first window 104 disposed to allow the air, which flows into the casing 101 through the first opening 102, to be discharged outward from the casing 101 may be formed at the second casing 101b. That is, the outside air which flows into the casing 101 through the first opening 102 may sequentially pass through a first air blower 121 (e.g., a fan) and the heat exchanger 110 and then be discharged outward from the casing 101 through the first window 104. The first window 104 may be formed at the second casing 101b to be located below the first opening 102. However, positions of the first window 104 and the first opening 102 are not limited to the above example and are variously changeable.

The first opening 102 may be formed at a position aligned to the inlets 14. The first window 104 may be formed at a position aligned to the outlets 15.

A vent 106 may be formed at the second casing 101b. The vent 106 may be formed at a side of the second casing 101b. The vent 106 may be provided to connect with the first air blower 121, which will be described below. The vent 106 may be disposed to be adjacent to the first air blower 121. The vent 106 may be disposed to be adjacent to the first opening 102 and the second window 105. The vent 106 may be disposed to allow a first cooling flow path P1 and a second cooling flow path P2 to connect with each other. The vent 106 may be extended lengthwise in a vertical direction. Alternatively, the vent 106 may be formed by consecutively arranging a plurality holes (e.g., a grille) in a vertical direction.

The vent 106 may suction outside air into the second cooling flow path P2 or may discharge air in the second cooling flow path P2 to the outside by allowing the second cooling flow path P2 to connect to the outside. In detail, when an internal pressure of the housing 10 in which the second cooling flow path P2 is formed is lower than an internal pressure of the housing 10 in which the first air blower 121 is disposed on the basis of the vent 106, outside air may flow into the second cooling flow path P2 through the vent 106 (in a C direction). On the other hand, when the internal pressure of the housing 10, in which the second cooling flow path P2 is formed, is higher than the internal pressure of the housing 10, in which the first air blower 121 is disposed on the basis of the vent 106, the air in the second cooling flow path P2 may be discharged outward from the second cooling flow path P2 through the vent 106 (in a D direction). That is, as air flows into or is discharged from the second cooling flow path P2 through the vent 106, pressures inside and outside the housing 10 of the display apparatus 1 may be approximately balanced.

The vent 106 may be formed on only one surface of the second casing 101b or may be formed on of both sides of the second casing 101b.

The second casing 101b may include a filter member 107. The filter member 107 may be disposed at one part at which the vent 106 is provided, to prevent foreign substances from flowing into the second cooling flow path P2 through the vent 106. The filter member 107 may be disposed to cover the vent 106. The filter member 107 may be configured to filter out moisture and/or dust in the air which flows into the second cooling flow path P2 from the outside. The filter member 107 may protect the display module 30 disposed in the housing 10 from outside foreign substances.

Referring to FIGS. 6 and 7, the heat exchange device 100 may further include the heat exchanger 110 disposed in the casing 101. The heat exchanger 110 may include at least one first channel 111 and at least one second channel 112, which are extended lengthwise in the vertical direction H of the display apparatus 1.

The first channel 111 may be formed to face the second casing 101b. The second channel 112 may be formed to face the first casing 101a. That is, the second channel 112 may be disposed to face the display module 30. The first channel 111 and the second channel 112 may be alternately disposed (e.g., by way of accordion-like folds).

The heat exchanger 110 may further include a heat exchange fin 113 which comparts a plurality of channels. The heat exchange fin 113 may prevent air which flows through the first channel 111 and air which flows through the second channel 112 from being mixed with each other.

The heat exchange device 100 may further include the first air blower 121. The first air blower 121 may be disposed in the casing 101 to suction outside air through the inlets 14 and the first opening 102 and discharge the air through the first window 104 and the outlets 15. The first air blower 121 may be disposed above the heat exchanger 110. The first air blower 121 may be connected to the inlets 14.

The first air blower 121 may be connected with the vent 106. The first air blower 121 may supply a part of the air suctioned in through the first opening 102 to the second cooling flow path P2 or may suction and discharge the air in the second cooling flow path P2 to the outside. In detail, when the controller 50 controls the first air blower 121 such that a pressure of the second cooling flow path P2 is lower than a pressure where the first air blower 121 is disposed, the first air blower 121 may supply air to the second cooling flow path P2. When the controller 50 controls the first air blower 121 such that the pressure of the second cooling flow path P2 is higher than the pressure where the first air blower 121 is disposed, the first air blower 121 may suction in and discharge the air in the second cooling flow path P2 to the outside.

The first air blower 121 may include a first blowing case 123 and a first blowing fan 125 accommodated in the first blowing case 123. The first blowing fan 125 may generate a suction force to allow outside air to flow into the casing 101 through the first opening 102. The first blowing case 123 may be attached to the first casing 101a. The first air blower 121 may further include a first fan motor which drives the first blowing fan 125.

The heat exchange device 100 may further include the second air blower 122. The second air blower 122 may be disposed in the casing 101 to suction in air heat-exchanged with the display module 30 through the second opening 103 and to discharge the air through the second window 105. The second air blower 122 may be disposed to allow the air in the second cooling flow path P2 to flow. The second air blower 122 may be disposed below the heat exchanger 110. The second air blower 122 may be connected to the second opening 103.

The second air blower 122 may include a second blowing case 124 and a second blowing fan 126 accommodated in the second blowing case 124. The second blowing fan 126 may generate a suction force to allow air to flow into the casing 101 through the second opening 103. The second blowing case 124 may be attached to the second casing 101b. The second air blower 122 may further include a second fan motor which drives the second blowing fan 126.

The display apparatus 1 may include the first cooling flow path P1 and the second cooling flow path P2 formed in the housing 10 to cool the heat received from the display module 30 and/or the controller 50. The first cooling flow path P1 and the second cooling flow path P2 may be connected with each other via the vent 106.

The first cooling flow path P1 may connect the inlets 14 to the outlets 15. Air suctioned in through the inlets 14 of the housing 10 may move along the first cooling flow path P1. Outside air may flow through the first cooling flow path P1.

The second cooling flow path P2 may meet the first cooling flow path P1 at the heat exchange device 100. In other words, the second cooling flow path P2 may be interlocked with the first cooling flow path P1 at the heat exchange device 100. Here, the air which moves along the first cooling flow path P1 and the air which moves along the second cooling flow path P2 may discharge heat at the heat exchange device 100 but not necessarily be mixed with each other. The air that exchanges heat with the air which moves along the first cooling flow path P1 at the heat exchange device 100 may circulate along the second cooling flow path P2 to cool the display module 30 and the controller 50. That is, the air exchanging heat with the display module 30 and the controller 50 may flow through the second cooling flow path P2.

The second cooling flow path P2 may be formed along a perimeter of the display module 30. The second cooling flow path P2 may be formed in the housing 10.

The first channel 111 of the heat exchanger 110 may be positioned at the first cooling flow path P1. The second channel 112 of the heat exchanger 110 may be positioned at the second cooling flow path P2. The relatively warm air which moves along the second cooling flow path P2 may discharge heat to the relatively cool air which moves along the first cooling flow path P1 at the heat exchanger 110. Through this, the display module 30 may be prevented from overheating and as a result deterioration of the display panel 31 may be prevented.

The display apparatus 1 may further include a heat transfer path 60. The heat transfer path 60 may be provided between the display module 30 and the heat exchange device 100 to transfer heat received from the display module 30 to the heat exchange device 100. Here, the heat may be transferred by using a heat conduction method.

Outside air may move along the first cooling flow path P1. The outside air which is relatively cool may sequentially pass through the inlets 14 and the first opening 102 and flow into the first channel 111 of the heat exchanger 110 due to a suction force of the first blowing fan 125. The outside air which moves along the first channel 111 may exchange heat with the inside air which moves along the second channel 112. The inside air may be cooled through this process. The outside air, which completes heat exchange with the inside air, sequentially passes the first window 104 and the outlets 15 and is discharged outward from the display apparatus Inside air may move along the second cooling flow path P2. The inside air may be heated by sunlight, the display module 30, the controller 50, and the like. Accordingly, the inside air may be relatively warm. The inside air passes through the second opening 103 and flows into the second channel 112 of the heat exchanger 110 due to a suction force of the second blowing fan 126. The inside air which moves along the second channel 112 exchanges heat with the outside air which moves along the first channel 111. Here, the inside air may lose heat thereof to the outside air. The inside air, which completes heat exchange with the outside air, passes through the second window 105 and is discharged toward the display module 30 while being relatively cool. The inside air discharged outward from the heat exchange device 100 circulates along the perimeter of the display module 30.

Referring to FIG. 8, temperature sensors 53 and 108 for measuring a temperature of the second cooling flow path P2 may be provided at the second cooling flow path P2. The temperature sensors 53 and 108 may include a first temperature sensor 108 disposed to be adjacent to the second opening 103 of the heat exchange device 100 and/or a second temperature sensor 53 disposed at the controller 50.

The first temperature sensor 108 may measure a temperature when the air exchanging heat with (e.g., absorbing heat from) the display module 30 and the controller 50 at the second cooling flow path P2 flows into the second opening 103. The second temperature sensor 53 may measure a temperature of the air that exchanged heat with the controller 50. The display apparatus 1 may include only any one of the first temperature sensor 108 and the second temperature sensor 53.

In addition, a pressure sensor 109 for measuring a pressure (e.g., air pressure) of the second cooling flow path P2 may be provided at the second cooling flow path P2. The pressure sensor 109 may be disposed to be adjacent to the second opening 103 of the heat exchange device 100. Alternatively, the pressure sensor 109 may be formed at the controller 50 or may be disposed at a location inside the housing 10 where the second cooling flow path P2 is formed.

When an internal pressure of the second cooling flow path P2 measured by the pressure sensor 109 is higher than a predetermined pressure, the controller 50 may control the first air blower 121 to reduce a rotational speed of the first air blower 121 to discharge air in the second cooling flow path P2 outward from the housing 10.

Sunlight incident on a front surface of the display apparatus 1 may increase a temperature of the display panel 31. Also, the backlight unit provided at the display module 30 to supply light may operate as a heating element and increase an internal temperature of the housing 10. Also, the controller 50 may also increase the internal temperature of the housing 10 by emitting heat during a process of driving the display module 30. When the internal temperature of the housing 10 increases, a temperature of the display module 30 may also increase. Excessive heating of the display module 30 may lead to deterioration of the display panel 31. The display apparatus 1 according to an aspect of an example embodiment may prevent deterioration of the display panel 31 through the above-described components.

Figure 9:
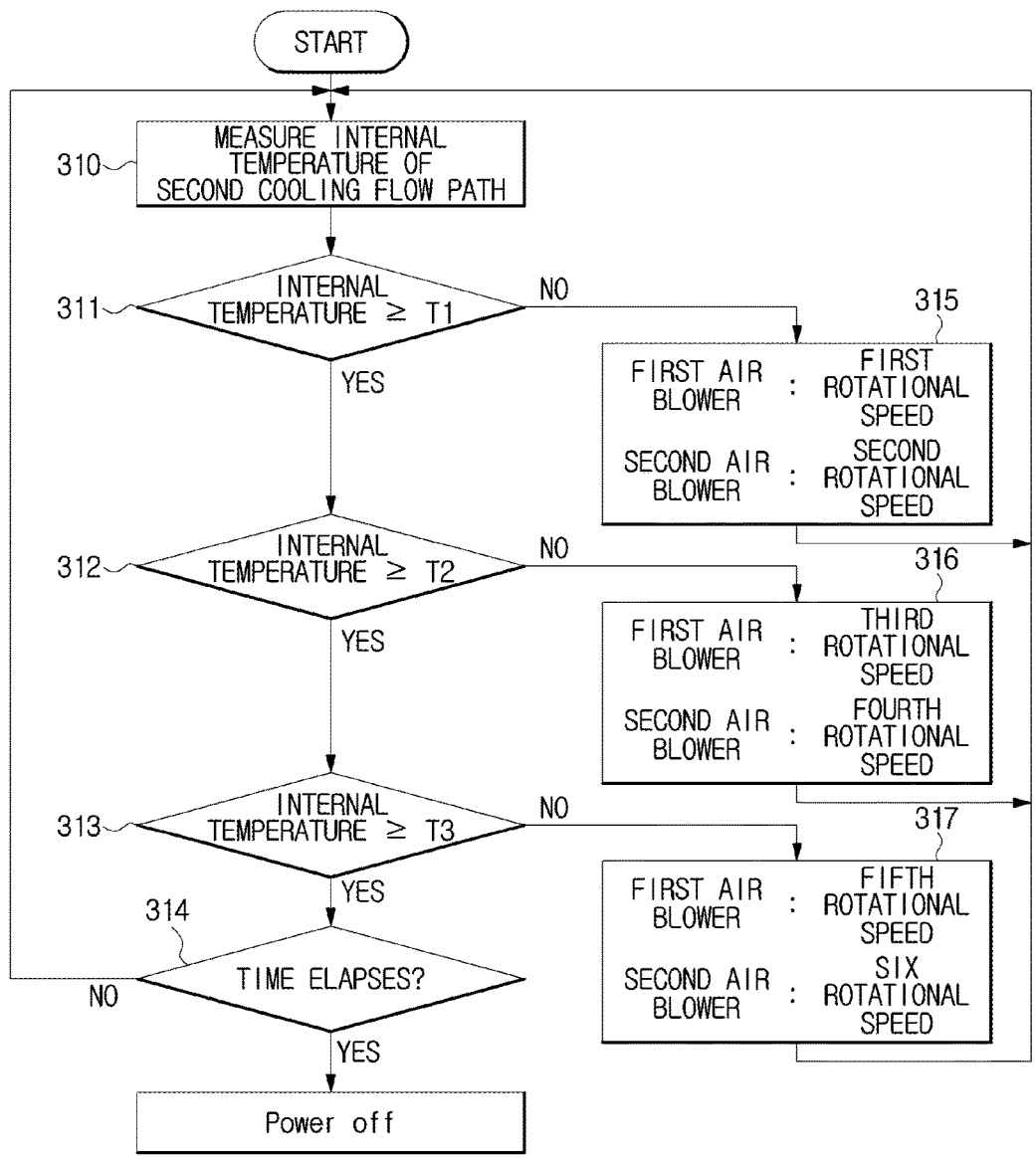
FIG. 9 is a flowchart illustrating an example of controlling an air blower according to an internal temperature of the display apparatus shown in FIG. 1 in a method of controlling the display apparatus.

FIG. 9 is a flowchart illustrating an example of controlling the air blower according to an internal temperature of the display apparatus shown in FIG. 1 in a method of controlling the display apparatus.

Referring to FIGS. 8 and 9, the display apparatus 1 may be configured to measure an internal temperature of the second cooling flow path P2 and the controller 50 may be configured to control the first air blower 121 and the second air blower 122 based on the measured temperature. In detail, the controller 50 may control a rotational speed of each of the first air blower 121 and the second air blower 122.

After the display apparatus 1 starts operating, the first temperature sensor 108 and/or the second temperature sensor 53 may measure a temperature of the second cooling flow path P2 at regular time intervals (310). Here, a measurement time interval may be about 1 second. Hereinafter, a first reference temperature T1, a second reference temperature T2, and a third reference temperature T3 may be set by a user and/or a manager, and particularly, may be set in consideration of surroundings and/or local environment of a place where the display apparatus 1 is installed. However, the first reference temperature T1 is set to be lower than the second reference temperature T2, and the second reference temperature T2 is set to be lower than the third reference temperature T3.

The measured internal temperature is compared to the first reference temperature T1 (311). When the measured internal temperature is less than the first reference temperature T1, the controller 50 may control the first air blower 121 to have a first rotational speed and control the second air blower 122 to have a second rotational speed (315). Here, the second rotational speed may be at or above the first rotational speed. Sequentially, the controller 50 may control the temperature sensors 108 and 53 to measure the temperature of the second cooling flow path P2 again.

When the measured internal temperature is at or above the first reference temperature T1, the measured internal temperature is compared to the second reference temperature T2 (312). When the measured internal temperature is less than the second reference temperature T2, the controller 50 may control the first air blower 121 to have a third rotational speed and control the second air blower 122 to have a fourth rotational speed (316). Here, the fourth rotational speed may be at or above the third rotational speed. Here, the third rotational speed may be at or above the first rotational speed. The fourth rotational speed may be at or above the second rotational speed. Sequentially, the controller 50 may control the temperature sensors 108 and 53 to measure the temperature of the second cooling flow path P2 again.

When the measured internal temperature is at or above the second reference temperature T2, the measured internal temperature is compared to the third reference temperature T3 (313). When the measured internal temperature is less than the third reference temperature T3, the controller 50 may control the first air blower to have a fifth rotational speed and control the second air blower 122 to have a sixth rotational speed (317). Here, the sixth rotational speed may be at or above the fifth rotational speed. The fifth rotational speed may be at or above the third rotational speed. The sixth rotational speed may be at or above the fourth rotational speed. Sequentially, the controller 50 may control the temperature sensors 108 and 53 to measure the temperature of the second cooling flow path P2 again.

However, when the measured internal temperature is at or above the third reference temperature T3, it is determined whether this state is maintained for at least a specific amount of time (314). When this state is not maintained for at least the specific amount of time (e.g., threshold time amount), the controller 50 may control the temperature sensors 108 and 53 to measure the temperature of the second cooling flow path P2 (310). However, when this state (e.g., internal temperature is at or above the third reference temperature T3) is maintained for the specific amount of time or longer, the controller 50 may control power to be disconnected from the display apparatus 1. Here, the specific amount of time may be set to be 60 seconds but is not limited thereto, and a time of maintaining the third reference temperature T3 or more may be set in consideration of the surroundings and/or local environment of the place where the display apparatus 1 is installed.

According to the above-described configuration, since the display apparatus 1 according to the example embodiment may effectively cool the display module 30, it is possible to provide safety of use.

Figure 10:
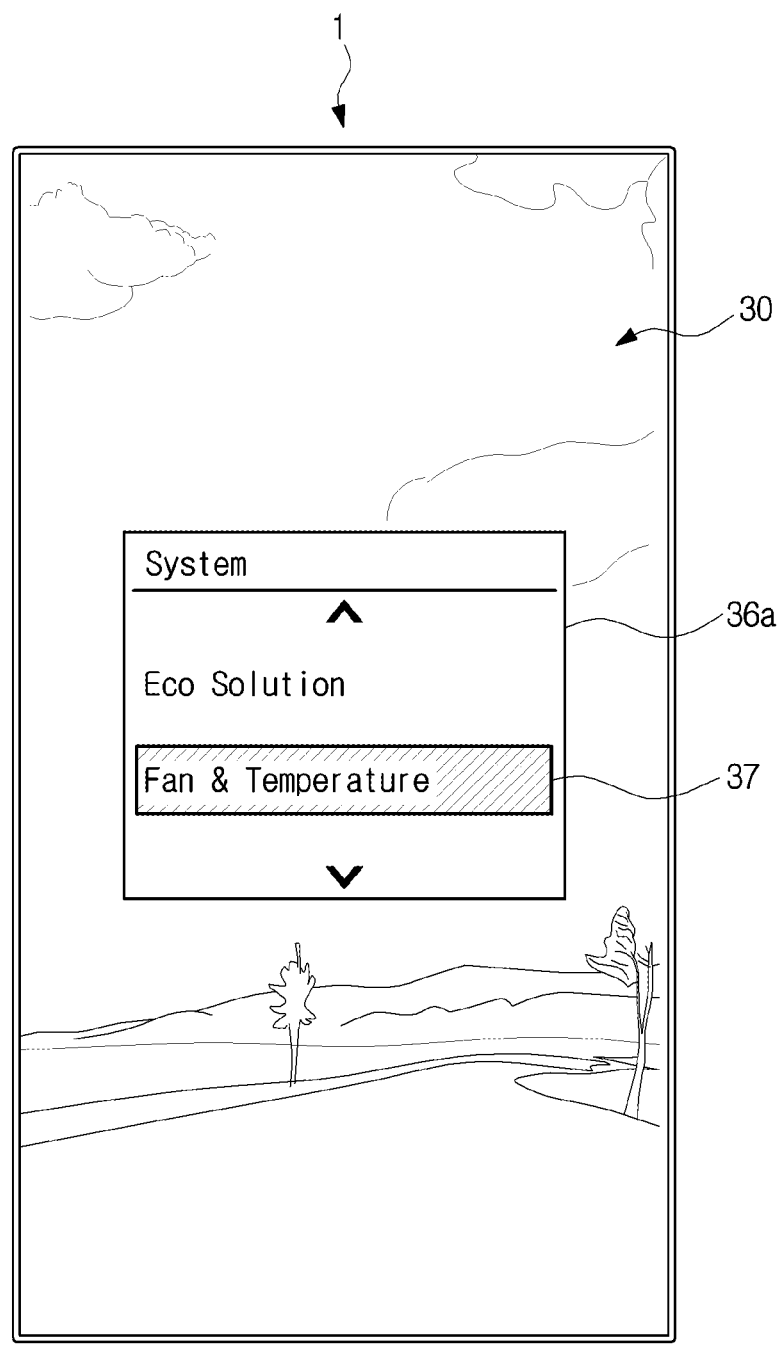
FIGS. 10 and 11 are views illustrating examples of a screen displayed on the display apparatus to provide information related to mode conversion of an air blower shown in FIG. 3.
Figure 11:
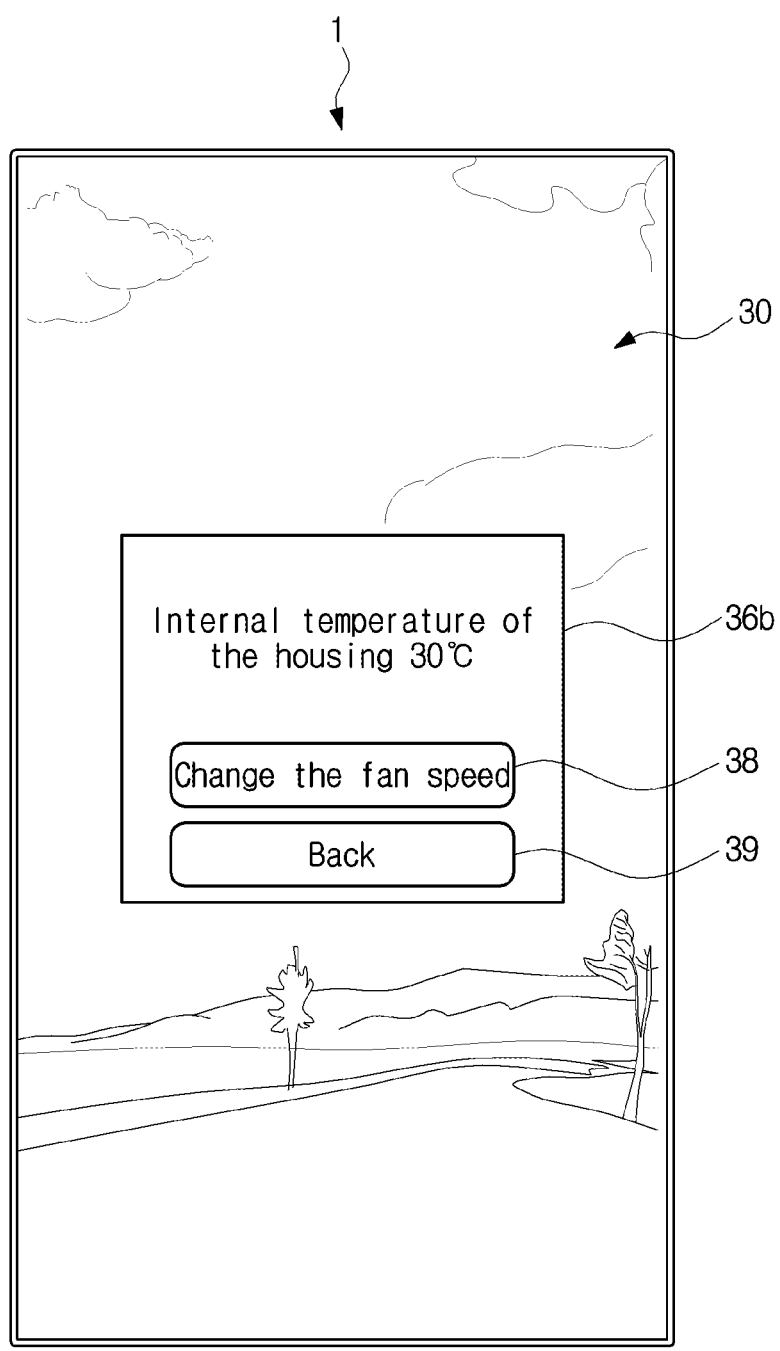

FIGS. 10 and 11 are views illustrating examples of a screen displayed on the display apparatus to provide information related to mode conversion of the air blower shown in FIG. 3.

Referring to FIGS. 8, 10, and 11, in the case of the display apparatus 1, rotational forces of the air blowers 121 and 122 may be manually changed.

The display apparatus 1 may include an input device 70 configured to allow a user to input a command. The input device 70 may be a remote control. Alternatively, the input device 70 may be a touch panel provided at the display module 30.

When the user inputs a command "menu" to the controller 50 via the input device 70, the display apparatus 1 may provide information related to temperatures of the air blowers 121 and 122 and the second cooling flow path P2 by displaying an information screen 36a for checking the information related to the temperatures of the air blowers 121 and 122 and the second cooling flow path P2 on the display module 30.

When the user selects a menu item "Fan & Temperature" 37, a current temperature of the second cooling flow path p2 may be displayed on the display module 30. When the user checks the displayed temperature and then intends to increase the driving forces of the air blowers 121 and 122, the user may select a menu item "Change the fan speed" 38 via the input device 70. When the user intends to maintain driving forces of the air blowers 121 and 122, the user may select a menu item "Back" 39 via the input device 70.

According to the above configuration, the user may manually control the cooling of the display module 30.

Figure 12:
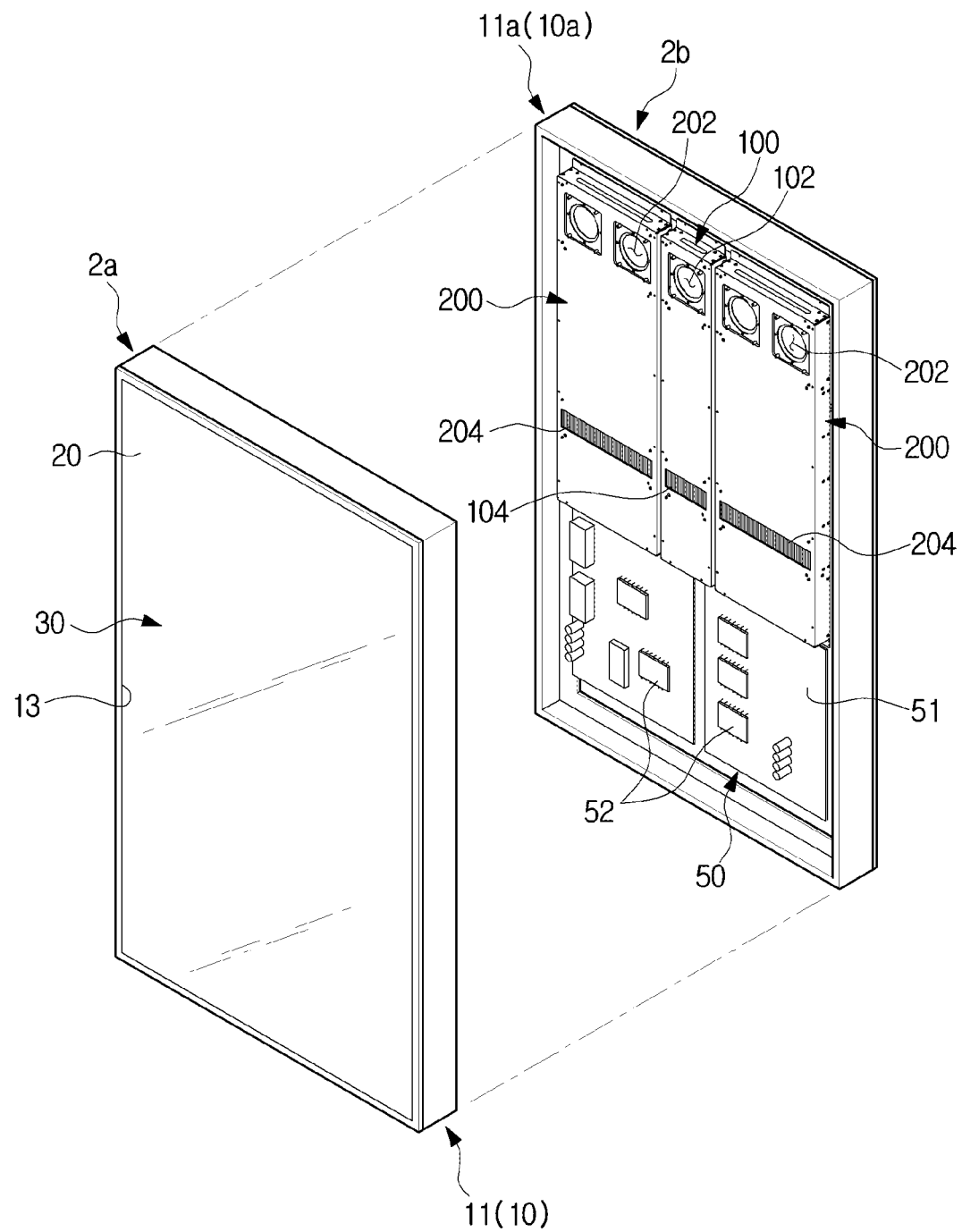
FIG. 12 is a view of a display apparatus according to another embodiment.
Figure 13:
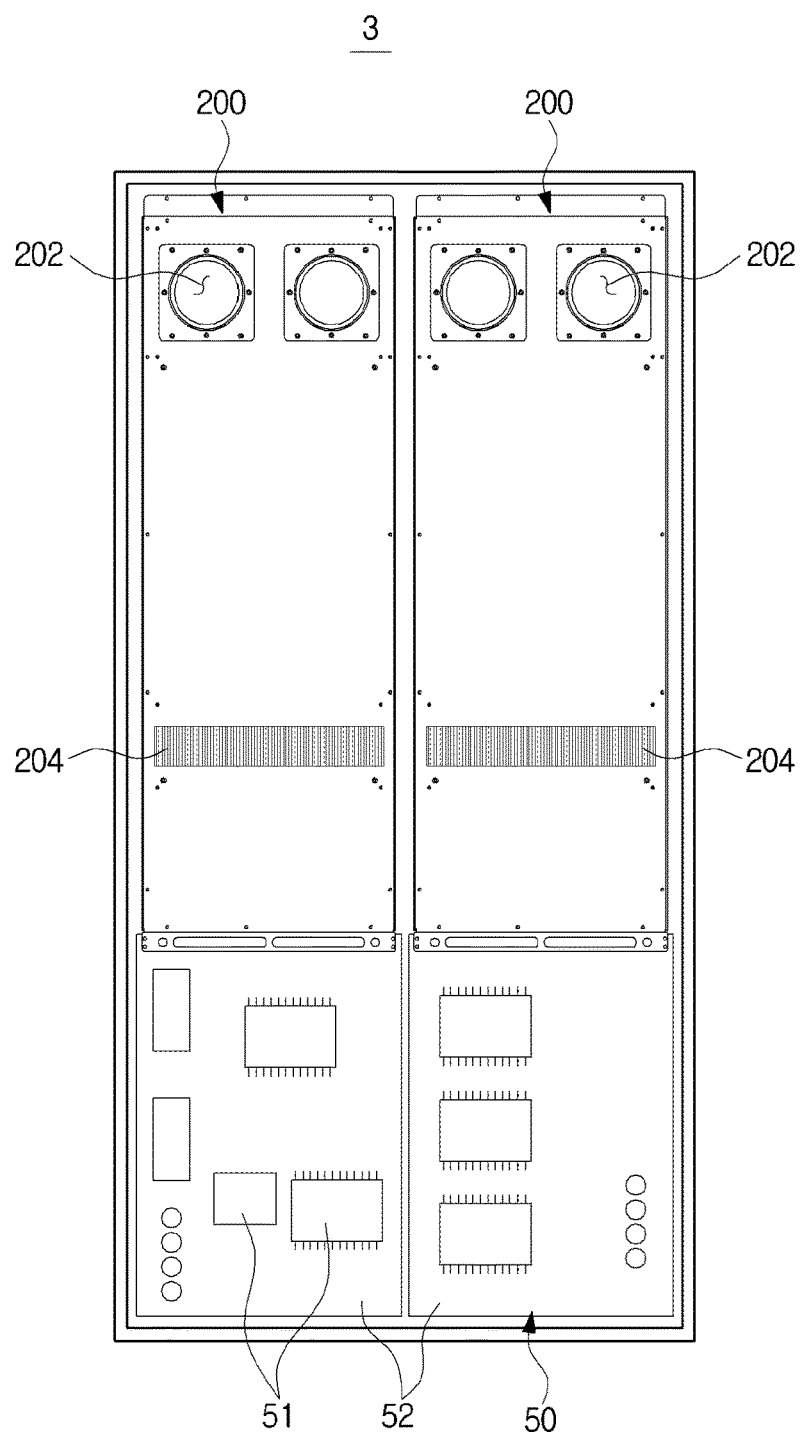
FIG. 13 is a view of a display apparatus according to still another example embodiment.
Figure 14:
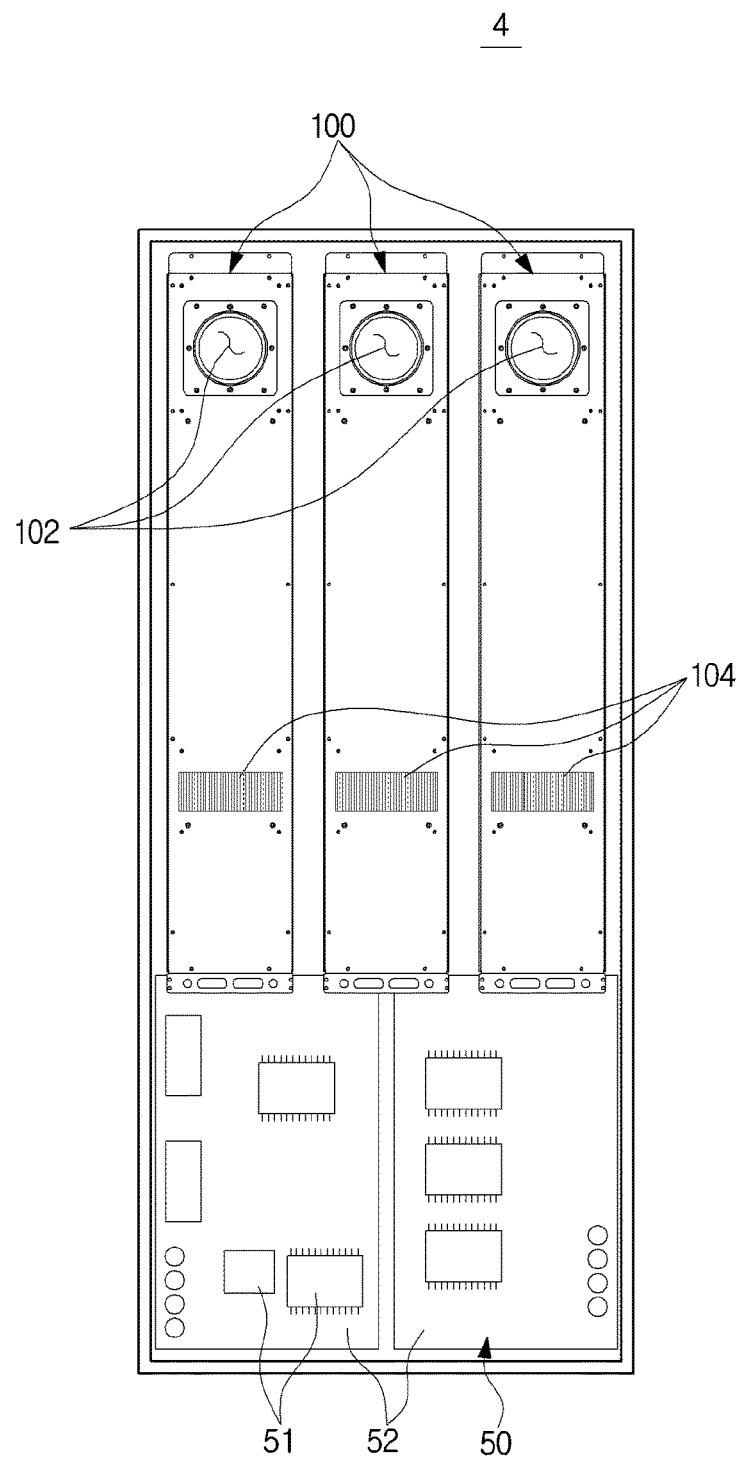
FIG. 14 is a view of a display apparatus according to yet another example embodiment.

FIG. 12 is a view of a display apparatus according to another example embodiment. FIG. 13 is a view of a display apparatus according to still another example embodiment. FIG. 14 is a view of a display apparatus according to yet another example embodiment.

Display apparatuses according to a variety of example embodiments of the present disclosure will be described with reference to FIGS. 12 to 14. However, like reference numerals refer to like element as the above-described embodiments, and a description thereof will be omitted.

Referring to FIG. 12, unlike the display apparatus 1 shown in FIG. 1, display apparatuses 2a and 2b according to another example embodiment may be provided to display information in both directions opposite to each other.

In detail, unlike the display apparatus 1 shown in FIG. 1, the display apparatuses 2a and 2b shown in FIG. 12 may be coupled to each other while rear surfaces thereof face each other without the second frame 12, to form one display apparatus. That is, the display apparatuses 2a and 2b are coupled to each other and form one display apparatus when the display modules 30 of the display apparatuses 2a and 2b are positioned in opposite directions.

Here, heat exchange devices 100 and 200 may include a first heat exchange device 100 which may correspond to the heat exchange device 100 shown in FIG. 3 and a second heat exchange device 200 having roughly twice the size of that of the heat exchange device 100 shown in FIG. 3. Unlike the heat exchange device 100 shown in FIG. 3, the second heat exchange device 200 may include two first openings 202 and two first windows 204.

In addition, the display apparatuses 2a and 2b may include openings formed on top surfaces thereof and through which air, which flows into the first openings 202, flows into the housing 10. Additionally, the display apparatuses 2a and 2b may include openings formed on bottom surfaces thereof and through which air discharged through the first windows 204 is discharged outward from the housing 10.

Referring to FIG. 13, when a size of a display apparatus 3 is smaller than a size of the display apparatus 1 shown in FIG. 1, two second heat exchange devices 200 shown in FIG. 12 may be applied to the display apparatus 3 shown in FIG. 13.

Alternatively, referring to FIG. 14, when a size of a display apparatus 4 is smaller than the size of the display apparatus 3 shown in FIG. 13, three heat exchange devices 100 shown in FIG. 3 may be applied to the display apparatus 4 shown in FIG. 14.

As described above, since the heat exchange devices 100 and 200 according to the example embodiment may be applied corresponding to the sizes of the display apparatuses 1, 2, 3, and 4 in various methods, compatibility thereof may increase. However, although the second heat exchange device 200 has been described as having the size twice that of the first heat exchange device 100, the sizes of the heat exchange devices are not limited thereto and may be various as necessary.

As is apparent from the above description, a display apparatus according to one or more example embodiments may provide improved cooling efficiency of a display module by cooling the display module through not only indirect heat exchange of the inside air which cools the display module with the outside air but also mixing the inside air with outside air which flows in through a vent.

A display apparatus according to one or more example embodiments may protect a display module from external foreign substances such as moisture and/or dust by disposing a filter member at a vent through which outside air which flows into an internal flow channel to cool the display module.

A display apparatus according to one or more example embodiments may allow outside air to flow into the display apparatus or discharge air in an internal flow channel outward from the display apparatus by changing the number of revolutions of an air blower to maintain balance between an internal pressure and an external pressure of the display apparatus even when a temperature changes.

Although a few example embodiments of the present disclosure have been shown and described, it would be appreciated by those skilled in the art that changes may be made in these embodiments without departing from the principles and spirit of the present disclosure, the scope of which is defined in the claims and their equivalents.

What is claimed is:

1. A display apparatus comprising:
a housing comprising an inlet and an outlet;
a display panel disposed in the housing;
a heat exchange device disposed in the housing, and comprising:
a first air blower;

a second air blower;

a heat exchanger interposed between the first air blower and the second air blower, and comprising a first channel, a second channel in parallel with the first channel, and a heat exchange fin separating the first channel from the second channel; and a first cooling flow path starting from the inlet, then through the first air blower, the first channel, and the outlet, and then to an outside of the display apparatus;

a second cooling flow path starting from the inlet, then through the first air blower, then around the display panel, and then through the second air blower and the second channel; and a controller disposed in the housing, and configured to:

control the first air blower to suction in outside air through the inlet, supply the outside air to the first cooling flow path as a first flow of air, and supply the outside air to the to the second cooling flow path as a second flow of air to exchange heat with the display panel; and control the second air blower to suction in the second flow of air from a portion of the second cooling flow path that is around the display panel, and supply the second flow of air to the second channel to exchange heat with the first flow of air flowing through the first channel.

2. The display apparatus of claim 1, wherein the heat exchange device further comprises a casing, and wherein the first air blower and the second air blower are disposed in the casing.

3. The display apparatus of claim 2, wherein the casing comprises a vent configured to connect the first cooling flow path with the second cooling flow path.

4. The display apparatus of claim 3, wherein the casing comprises a filter configured to prevent foreign substances from flowing in through the vent.

5. The display apparatus of claim 4, wherein the foreign substances comprise moisture and dust.

6. The display apparatus of claim 1, the controller is further configured to control a rotational speed of the first air blower to:

suction in the outside air through the inlet, and supply the outside air to the second cooling flow path, by keeping a first air pressure at the first air blower to be higher than a second air pressure of the second cooling flow path; and suction in the second flow of air from the second channel, and discharge the second flow of air through the outlet to the outside of the display apparatus, by keeping the first air pressure at the first air blower to be lower than the second air pressure of the second cooling flow path.

7. The display apparatus of claim 6, wherein the controller is further configured to, based on the second air pressure of the second cooling flow path being higher than a predetermined pressure, reduce the rotational speed of the first air blower to suction in the second flow of air from the second channel, and discharge the second flow of air through the inlet to the outside of the display apparatus.

8. The display apparatus of claim 7, further comprising a pressure sensor disposed at the second cooling flow path, and configured to sense the second air pressure of the second cooling flow path.

9. The display apparatus of claim 6, wherein the controller is further configured to, based on an internal temperature of the second cooling flow path being higher than a predetermined temperature, control to increase the rotation speed of the first air blower to suction in the outside air through the inlet, and supply the outside air to the second cooling flow path.

10. The display apparatus of claim 9, further comprising a temperature sensor disposed at the second cooling flow path, and configured to sense the internal temperature of the second cooling flow path.

11. The display apparatus of claim 10, wherein the heat exchange device further comprises a casing, wherein the casing comprises an opening through which the second flow of air from the portion of the second cooling flow path that is around the display panel is suctioned in by the second air blower, and wherein the temperature sensor is disposed at either one or both of the opening and the controller.

12. The display apparatus of claim 3, wherein the vent is disposed adjacent to the first air blower.

13. The display apparatus of claim 1, wherein the heat exchange device comprises a first heat exchange device of a first size and a second heat exchange device of a second size different from the first size.

14. The display apparatus of claim 1, further comprising a heat transfer member interposed between the display panel and the heat exchange device.

15. The display apparatus of claim 3, wherein the casing comprises:

a first opening through which the outside air is suctioned in by the first air blower, the first opening corresponding to the inlet;

a first window through which the first flow of air is discharged to the outside of the display apparatus, the first window corresponding to the outlet;

a second opening through which the second flow of air from the portion of the second cooling flow path that is around the display panel is suctioned in by the second air blower; and a second window through which the second flow of air is supplied by the first air blower, and wherein the vent is disposed to be adjacent to the first opening and the second window.

* * * * *